(12) United States Patent
Wei et al.

(10) Patent No.: US 12,372,398 B2
(45) Date of Patent: Jul. 29, 2025

(54) CIRCUITRY AND METHODS OF OPERATING A PHOTODIODE

(71) Applicant: NewSouth Innovations Pty Limited, New South Wales (AU)

(72) Inventors: Yuan Wei, New South Wales (AU); Torsten Lehmann, New South Wales (AU); Leonardo Silvestri, New South Wales (AU)

(73) Assignee: NewSouth Innovations Pty Limited, New South Wales (AU)

( * ) Notice: Subject to any disclaimer, the term of this patent is extended or adjusted under 35 U.S.C. 154(b) by 0 days.

(21) Appl. No.: 18/257,656

(22) PCT Filed: Dec. 14, 2021

(86) PCT No.: PCT/AU2021/051485
§ 371 (c)(1),
(2) Date: Jun. 15, 2023

(87) PCT Pub. No.: WO2022/126178
PCT Pub. Date: Jun. 23, 2022

(65) Prior Publication Data
US 2024/0044704 A1    Feb. 8, 2024

(30) Foreign Application Priority Data
Dec. 18, 2020    (AU) ................. 2020904737

(51) Int. Cl.
*G01J 1/46*    (2006.01)
*G01J 1/44*    (2006.01)
(Continued)

(52) U.S. Cl.
CPC ............ *G01J 1/46* (2013.01); *H03F 3/45475* (2013.01); *G01J 2001/444* (2013.01);
(Continued)

(58) Field of Classification Search
CPC .. G01J 1/46; G01J 2001/444; G01J 2001/446; G01J 1/44; H03F 3/45475;
(Continued)

(56) References Cited

U.S. PATENT DOCUMENTS 4,846,183 A * 7/1989 Martin ............... G01N 21/3151
356/41
4,896,120 A * 1/1990 Kamil ................. H03F 3/45479
330/308
(Continued)

FOREIGN PATENT DOCUMENTS

CN    107816938 A    3/2018
WO    2014063137 A1   4/2014

OTHER PUBLICATIONS

Wei, Yuan, et al., "Photodiode working in zero-mode: detecting light power change with DC rejection and AC amplification", Optics Express, vol. 29, No. 12, Jun. 2021, pp. 18915-18931.

*Primary Examiner* — Georgia Y Epps
*Assistant Examiner* — Monica T Taba
(74) *Attorney, Agent, or Firm* — Myers Bigel, P.A.

(57) ABSTRACT

The present invention relates generally to a photodiode and, in particular, to operating a photodiode in a zero-mode operation, where the photodiode operates at either zero current or zero voltage. Accordingly, there is provided a circuit configured for detecting light, including a photodiode; and a circuit configured for operating the photodiode at zero-mode.

20 Claims, 8 Drawing Sheets

(51) Int. Cl.
  *G01S 7/497* (2006.01)
  *G02F 1/01* (2006.01)
  *H03F 3/45* (2006.01)
  *H04B 10/69* (2013.01)

(52) U.S. Cl.
  CPC ......... *G01J 2001/446* (2013.01); *G01S 7/497* (2013.01); *G02F 1/0123* (2013.01); *H03F 2200/261* (2013.01); *H04B 10/6911* (2013.01)

(58) Field of Classification Search
  CPC .. H03F 2200/261; G01S 7/497; G02F 1/0123; H04B 10/6911; G01R 31/2635; G01R 31/311; G01R 31/2656; G01R 31/275; G01R 31/2831; H02S 50/10; Y02E 10/50; G01N 21/66
  See application file for complete search history.

(56) References Cited

U.S. PATENT DOCUMENTS

| | | | |
|---|---|---|---|
| 5,656,806 A | * | 8/1997 | Dautriche .............. H04N 25/75 250/214 R |
| 2002/0134908 A1 | * | 9/2002 | Johnson ............ G01R 31/2635 250/200 |
| 2012/0105033 A1 | * | 5/2012 | Tateishi .................... G01J 1/44 323/272 |
| 2014/0111280 A1 | * | 4/2014 | Schuppener ............ H03F 3/456 330/291 |
| 2018/0131342 A1 | | 5/2018 | Zamprogno et al. |
| 2019/0173588 A1 | * | 6/2019 | Ahmed ................ H04B 10/693 |
| 2020/0145114 A1 | | 5/2020 | Tatsumi |
| 2021/0210964 A1 | * | 7/2021 | Cao .................... H02J 7/00045 |
| 2022/0031167 A1 | * | 2/2022 | Beldon ................ A61B 5/0075 |

\* cited by examiner

CIRCUITRY AND METHODS OF OPERATING A PHOTODIODE

RELATED APPLICATIONS

The present application is a 35 U.S.C. 371 national stage application of a PCT International Application No. PCT/AU2021/051485, filed on Dec. 14, 2021, which claims priority from Australian Provisional Patent Application No. 2020904737, filed Dec. 18, 2020, the contents of which are herein incorporated by reference in their entirety.

TECHNICAL FIELD

The present invention relates generally to a photodiode and, in particular, to operating a photodiode in a zero-mode operation, where the photodiode operates at either zero current or zero voltage.

BACKGROUND

A photodiode is commonly used to detect light power. Typically, an amplifier is used with a photodiode to amplify the output signal of the photodiode.

The two common modes of a photodiode are the photoconductive mode and the photovoltaic mode, which correspond to the photodiode being reverse biased and unbiased respectively. Both modes of operation detect light power, but with different characteristics. However, both modes of operation have difficulty in detecting small changes in light power in the presence of a constant background light. The constant background light may saturate the photodiode or occupy most of the maximum output voltage swing of the amplifier (resulting in the amplifier being unable to amplify the small changes in light power).

There are methods of reducing or cancelling the DC signal corresponding to the constant background light, such as filtering and differential amplification. However, such conventional methods may cause some problems such as saturation and noise increment. Further, differential amplification requires proper pre-configuration before use, which is inconvenient and may be complicated.

SUMMARY

It is an object of the present invention to substantially overcome, or at least ameliorate, one or more disadvantages of existing arrangements.

Disclosed are arrangements which seek to address the above problems by operating a photodiode in a zero-mode operation, where the photodiode operates at either zero current or zero voltage.

According to an aspect of the present disclosure, there is provided a circuit configured for detecting light, comprising: a photodiode; and a circuit configured for operating the photodiode at zero-mode.

Other aspects are also disclosed.

BRIEF DESCRIPTION OF THE DRAWINGS

Some aspects of the prior art and at least one embodiment of the present invention will now be described with reference to the drawings, in which.

DETAILED DESCRIPTION

Figure 1:
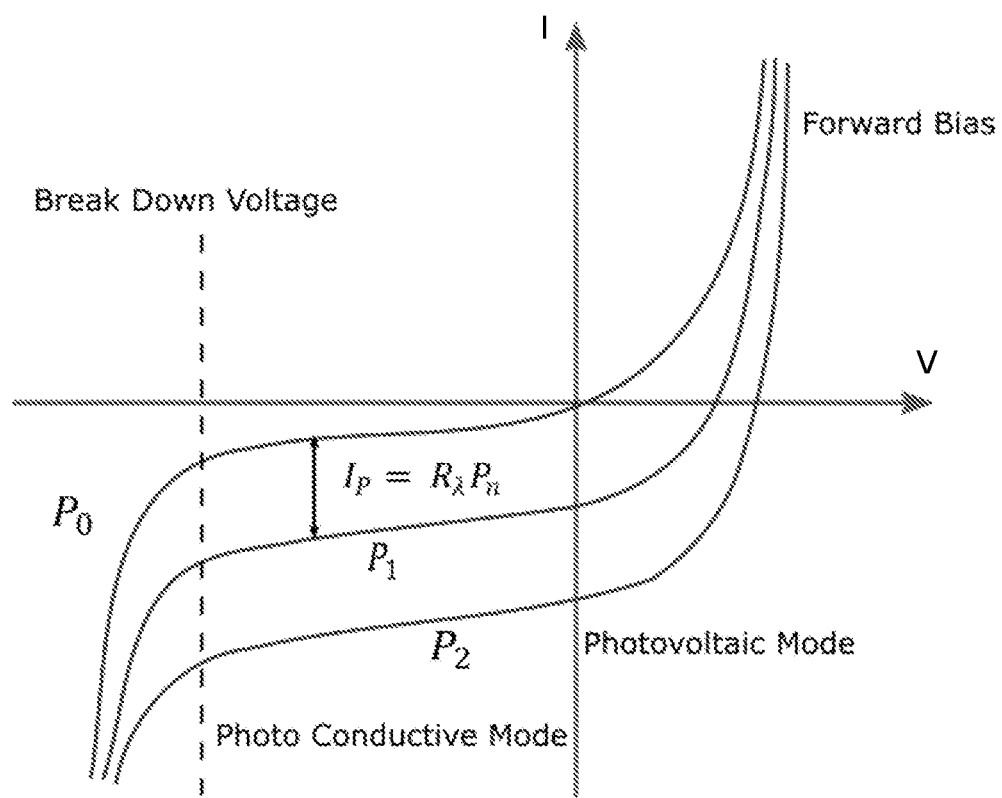
FIG. 1 shows a curve-voltage (I-V) curve of a photodiode.

Where reference is made in any one or more of the accompanying drawings to steps and/or features, which have the same reference numerals, those steps and/or features have for the purposes of this description the same function(s) or operation(s), unless the contrary intention appears.

FIG. 1 shows the current-voltage (I-V) curves of a photodiode, where each curve corresponds to light power (Pn) received by the photodiode. When light power increases (n increasing from 0 to n), the curve shifts as indicated in FIG. 1.

The photoconductive mode of a photodiode is in the quadrant where I<0 and V<0, where the photodiode is typically reverse biased. The I-V curve in the photoconductive mode is linear, which enables conversion from light power to electrical signal with good linearity.

The photovoltaic mode is in the quadrant where I<0 and V>0, where the photodiode is typically unbiased. The curve in the photovoltaic mode is not as linear as in the photoconductive mode, but photodiode in the photovoltaic mode consumes less power.

In the quadrant where I>0 and V>0, the photodiode is typically forward biased and acts like a normal diode where the curve shifts according to the light power received by the photodiode.

The different conventional modes are used for different needs.

It is to be noted that the discussions contained in the "Background" section and that above relating to prior art arrangements relate to discussions of documents or devices which form public knowledge through their respective publication and/or use. Such should not be interpreted as a representation by the present inventor(s) or the patent applicant that such documents or devices in any way form part of the common general knowledge in the art.

Figure 2:
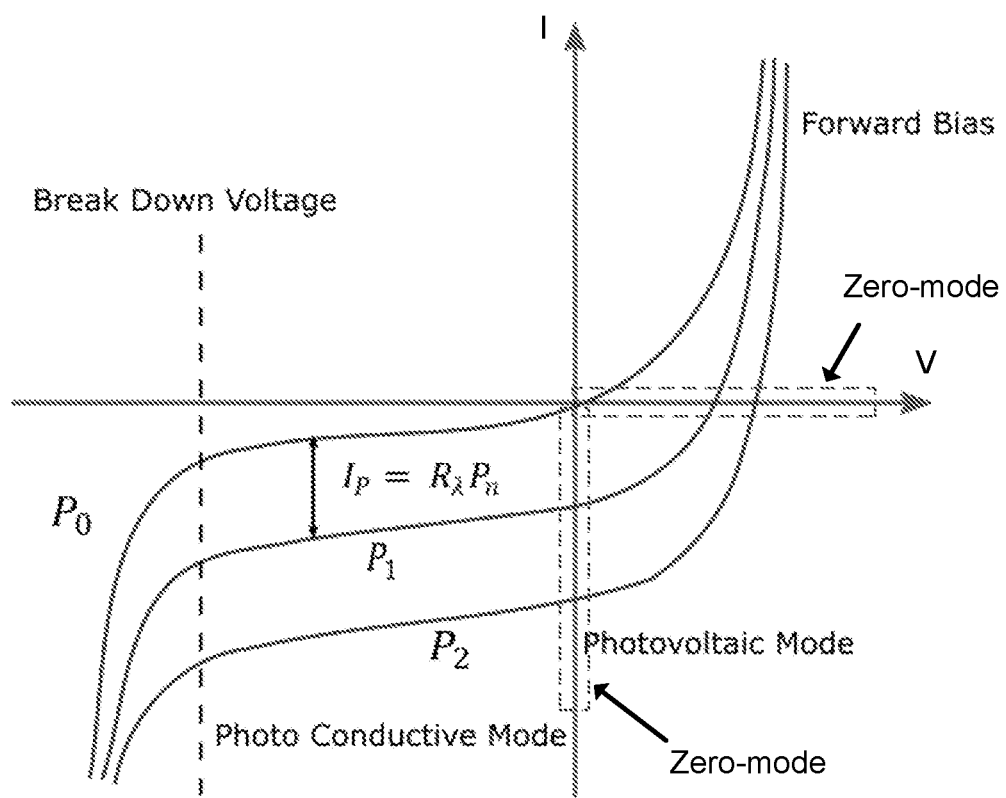
FIG. 2 shows a curve-voltage (I-V) curve of a photodiode indicating the zero-mode.

FIG. 2 shows the I-V curve of the photodiode indicating the zero-mode operation for operating the photodiode in accordance with the present disclosure. As can be seen in FIG. 2, the zero-mode operation refers to operating the photodiode when the current output of the photodiode (and associated circuitry) is zero (I=0) or when the voltage across the photodiode (and associated circuitry) is zero (V=0).

Although only the I=0 when V<0 and V=0 when I>0 are shown in FIG. 2, the zero-mode operation can also be achieved by shifting the curve in the photoconductive mode operation to the I=0 axis. The circuitry and associated operation of this scenario will be discussed below hereinafter in relation to FIGS. 6 and 7.

When there is no DC current or DC voltage associated with the photodiode (i.e., in zero-mode), the photodiode is capable of detecting small changes in received light power. Also, by eliminating the DC current or DC voltage, the small changes can be amplified using a large gain of an amplifier without saturating an amplifier by the DC level.

Circuit arrangements for operating a photodiode in zero-mode will now be described. As a person skilled in the art would appreciate, there are many circuit arrangements to operate a photodiode in zero-mode and that the below shown circuit arrangements are some example arrangements.

Figure 3A:
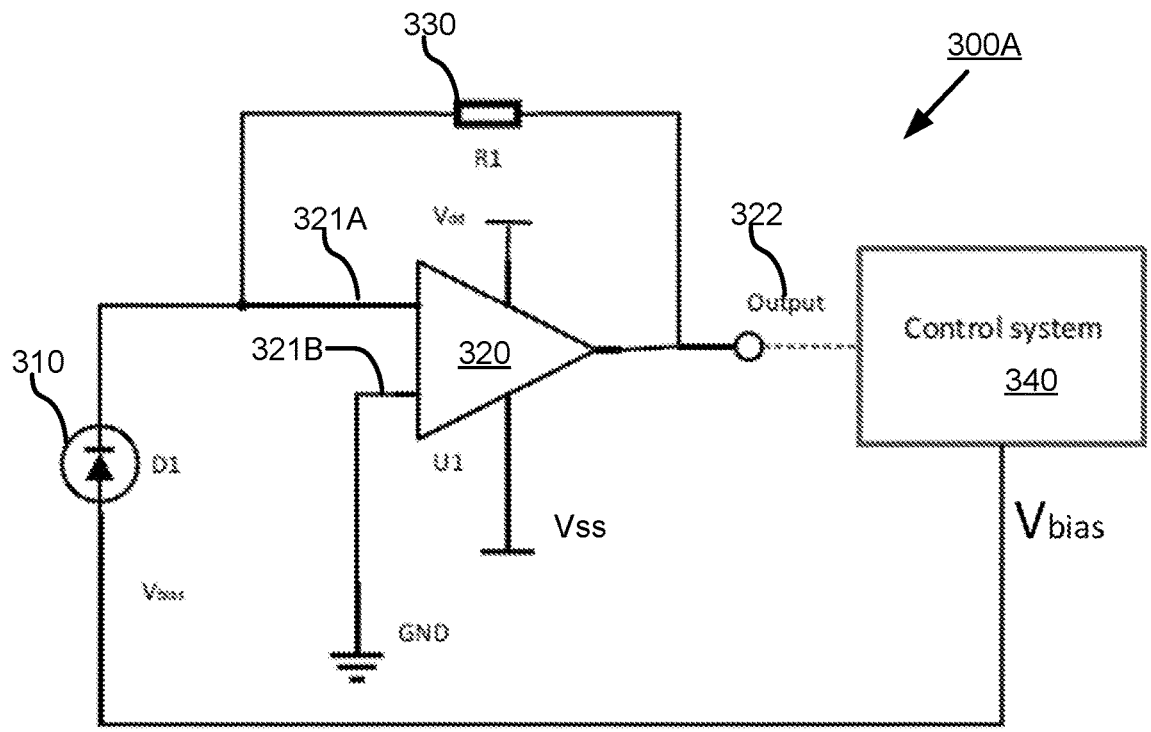
FIGS. 3A, 3B, 4 to 6, and 8 to 10 show different circuit arrangements for operating a photodiode in zero-mode.
Figure 3B:
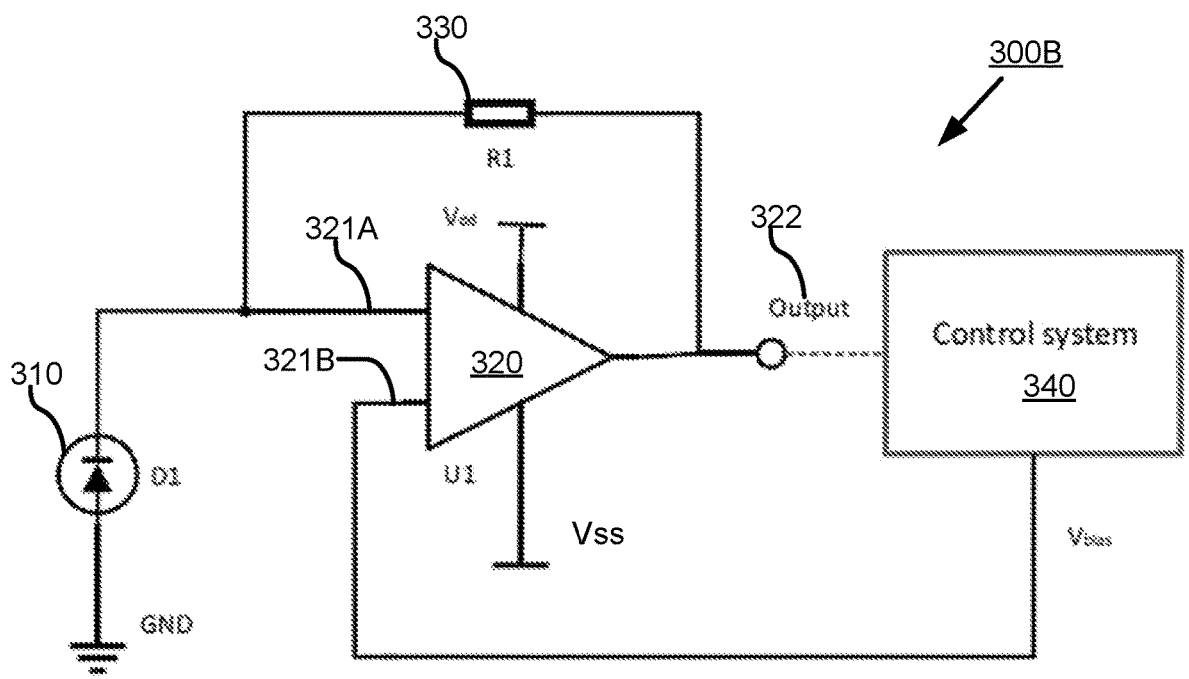

FIGS. 3A and 3B show two circuit arrangements 300A and 300B, respectively, for operating a photodiode in zero-mode. The circuits 300A and 300B, in which a photodiode 310 is disposed, force the work point of the photodiode 310 to the zero-current point (i.e., I=0 of the zero-mode at the V-axis) of the I-V curve (see FIG. 2) by forward biasing the photodiode 310. When the photodiode 310 (disposed in circuits 300A or 300B) receives a constant background light, the circuit 300A or 300B moves the operating point of the photodiode 310 along the I-V curve to the point intersecting the V-axis (I=0) of the I-V curve. Circuits 300A and 300B are provided with a bias voltage ($V_{bias}$) to move the operating point of the photodiode along the I-V curve to the zero-mode (i.e., I=0). Once the photodiode 310 is at the zero-mode, any fluctuations of light power received by the photodiode 310 results in corresponding fluctuations of the current $I_{AC}$ of the photodiode 310.

The operating point of a photodiode is also known as the work point or the operation point.

Circuit 300A includes a photodiode 310, an amplifier 320, a resistor 330, and a control system 340. The amplifier 320 has two source ports, namely Vdd and Vss, to receive electrical power. The source ports Vdd and Vss provide the full maximum output voltage swing of the amplifier 320. Vdd and Vss are a first supply voltage and a second supply voltage, respectively. The first supply voltage and the second supply voltage provide the voltage range (i.e., maximum output voltage swing) of the amplifier. Hereinafter, any reference to Vdd and Vss indicates the supply voltages at which a circuit is working. Vss is a value of 0V to any negative voltage.

The amplifier 320 has two input ports 321A, 321B and an output port 322. The input port 321A can be referred to as a first input port and the input port 321B can be referred to as a second input port. The amplifier 320 with its associated amplifying circuitry are only an example. A person skilled in the art would understand that other circuitry (e.g., closed-loop, open-loop, etc.) for amplification may be used. Further, the amplification circuit may also output current or voltage depending on the requirements of subsequent signal processing hardware. Further, the input ports 321A and 321B may receive current or voltage depending on the zero-mode used. Accordingly, hereinafter, the use of the amplifier 320 and its associated circuitry are only an example, which a person skilled in the art could modify accordingly to meet the circuitry requirements.

The output port 322 generates an output voltage Vo. The output port 322 is connected to one of the input ports 321A via the resistor 330 (R1), such that Vo=R×$I_{AC}$, where $I_{AC}$ is the AC current generated by the photodiode 310. The cathode of the photodiode 310 is also connected to the input port 321A. The other input port 321B is connected to ground.

The output port 322 is then connected to the control system 340. The control system 340 is in turn connected to the anode of the photodiode 310, so that a bias voltage $V_{bias}$ output of the control system 340 is provided to the photodiode 310 to shift the operating point of the photodiode 310 to the zero-mode (i.e., I=0) of the I-V curve of the photodiode 310. In another arrangement, the connection of the anode and cathode of the photodiode 310 are swapped.

It is unnecessary to completely shift the operating point of the photodiode 310 to I=0 (i.e., the point along the V-axis). As long as the operating point is shifted to be sufficiently close to the zero-mode, DC current is substantially eliminated. A value for $V_{bias}$ is determined by $V_{DCmax} \geq V_{bias} \geq V_{DCmin}$, where $V_{DCmax}$ and $V_{DCmin}$ are the bias voltages that provide the largest acceptable output DC current $I_{DCmax}$ and $I_{DCmin}$. The voltage Vo of the output port 322 is provided by the equation Vo=R*$I_{AC}$, where R is the value of the resistor 330.

The control system 340 provides a voltage $V_{bias}$ to shift the operating point of the photodiode 310 to the zero-mode. In one arrangement, the voltage $V_{bias}$ is determined by storing the output voltage of the amplifier 320 over a period of time and averaging the stored output voltage over that period of time. The control system 340 then determines whether the average stored output voltage is within the threshold described in the paragraph immediately above. If the average stored output voltage is within the threshold, then the average stored output voltage is output as $V_{bias}$.

Circuit 300B has the same components as circuit 300A. However, in circuit 300B, the anode of the photodiode 310 is connected to ground, while the input port 321B is connected to the output of the control system 340. The operation of circuit 300B is otherwise similar to the operation of circuit 300A. In another arrangement, the connection of the anode and cathode of the photodiode 310 of circuit 300B are swapped.

Figure 4:
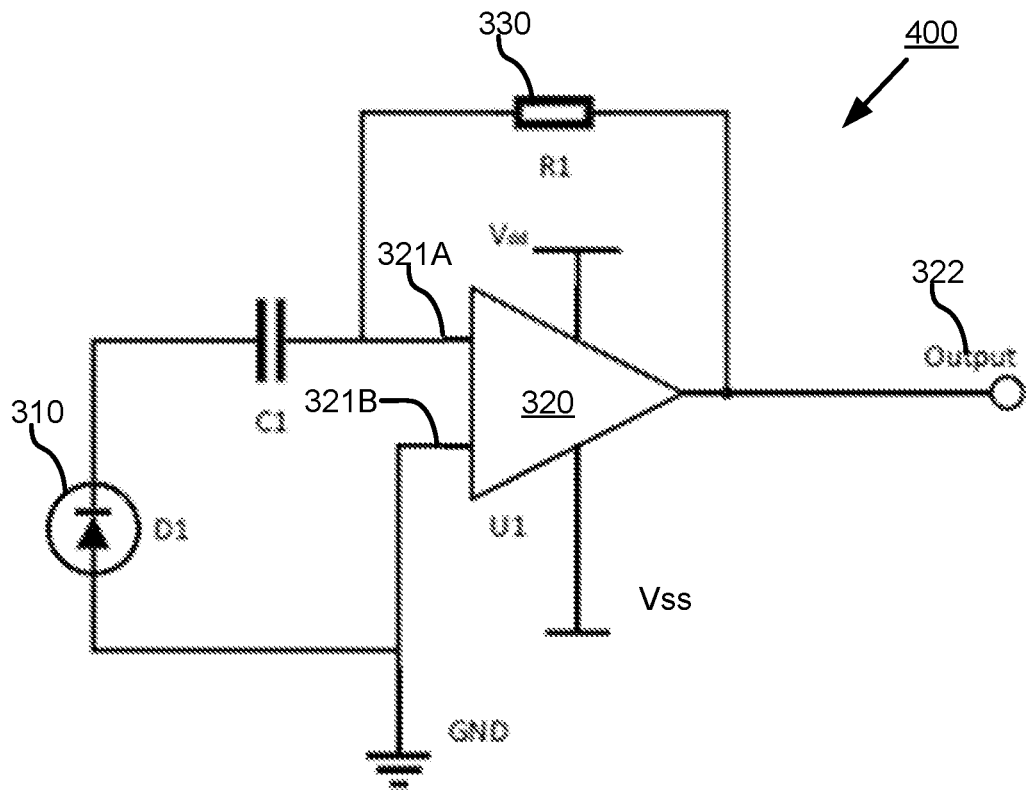

FIG. 4 illustrates a circuit arrangement 400 where the photodiode 310 is operated in zero-mode, so that the operating point of the photodiode 310 is moved to the zero-current point (i.e., I=0 of the zero-mode at the V-axis) of the I-V curve (see FIG. 2). Circuit 400 includes a photodiode 310, an amplifier 320, a resistor 330, and a capacitor C1. The amplifier 320 has two source ports, namely Vdd and Vss, to receive electrical power. The source ports Vdd and Vss provide the full maximum output voltage swing of the amplifier 320.

The amplifier 320 has two input ports 321A, 321B and an output port 322. The output port 322 generates an output voltage Vo. The output port 322 is connected to one of the input ports 321A via the resistor 330 (R1), such that Vo=R× $I_{AC}$, where $I_{AC}$ is the AC current generated by the photodiode 310. The cathode of the photodiode 310 is also connected to the input port 321A via a capacitor C1. The capacitor C1 acts like a high-pass filter between the photodiode 310 and the amplifier 320, blocking the DC component of the photodiode 310 from entering the amplifier 320 while allowing AC components to pass through to the amplifier 320. The anode of the photodiode 310 and the other input port 321B are connected to ground.

When the photodiode 310 detects light at certain power, the photodiode 310 generates a DC electrical current, which is blocked by the capacitor C1 from entering the input port 321A. In other words, circuit 400 acts like an open circuit (i.e., I=0) for the DC component of the photodiode 310. However, when fluctuating light power is received by the photodiode 310, the current generated acts like an AC component, which the capacitor C1 allows to pass.

Similar to circuits 300A and 300B, the voltage output Vo of the output port 322 is provided by the equation Vo=R*$I_{AC}$, where R is the value of the resistor 330.

Figure 5:
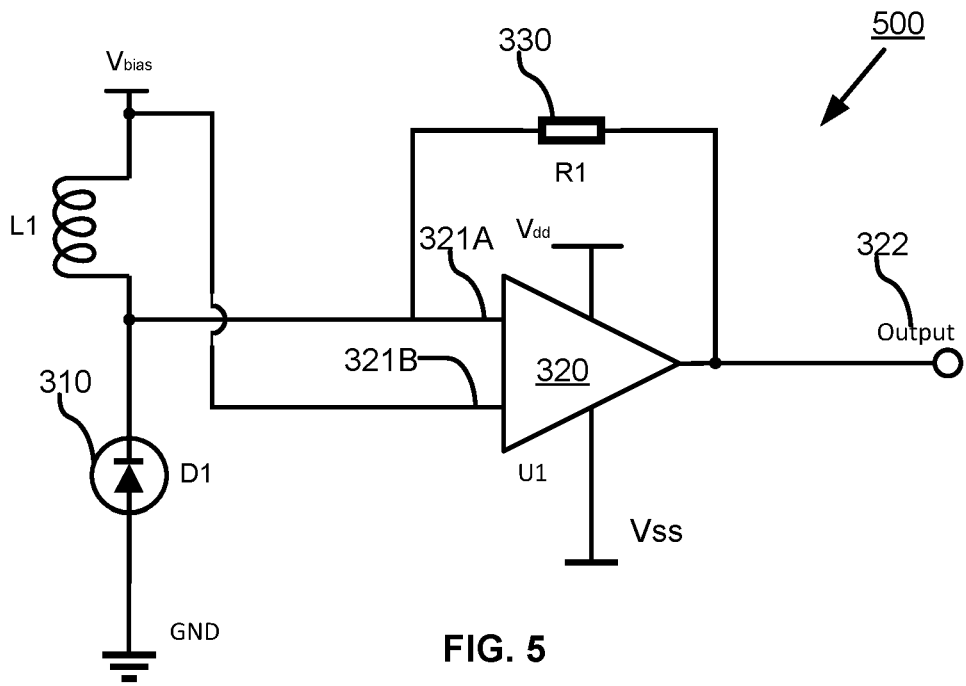

FIG. 5 illustrates a circuit arrangement 500 to operate the photodiode 310 in zero-mode. Circuit 500 includes a photodiode 310, an amplifier 320, a resistor 330, and an inductor L1. The amplifier 320 has two source ports, namely Vdd and Vss, to receive electrical power. The source ports Vdd and Vss provide the full maximum output voltage swing of the amplifier 320.

The amplifier 320 has two input ports 321A, 321B and an output port 322. The output port 322 generates an output voltage Vo. The output port 322 is connected to one of the input ports 321A via the resistor 330 (R1), such that Vo=R× $I_{AC}$, where $I_{AC}$ is the AC current generated by the photodiode 310. The cathode of the photodiode 310 is also connected to the input port 321A and is also connected to a bias voltage $V_{bias}$ via the inductor L1. The inductor L1 acts like a low-pass filter enabling the DC component of the photodiode 310 to flow from $V_{bias}$ to ground while blocking the AC components. As the AC components are blocked, the AC components flow into the input port 321A. The anode of the photodiode 310 is connected to ground. The other input port 321B is connected to $V_{bias}$.

When the photodiode 310 detects light at certain power, the photodiode 310 generates a DC electrical current, which is allowed to pass by the inductor L1 from $V_{bias}$ to ground. However, when fluctuating light power is detected, the photodiode 310 generates $I_{AC}$, which enters the input port 321A as $I_{AC}$ is blocked by the inductor L1.

Similar to circuits 300A and 300B, the voltage output Vo of the output port 322 is provided by the equation Vo=R*$I_{AC}$, where R is the value of the resistor 330.

Figure 6:
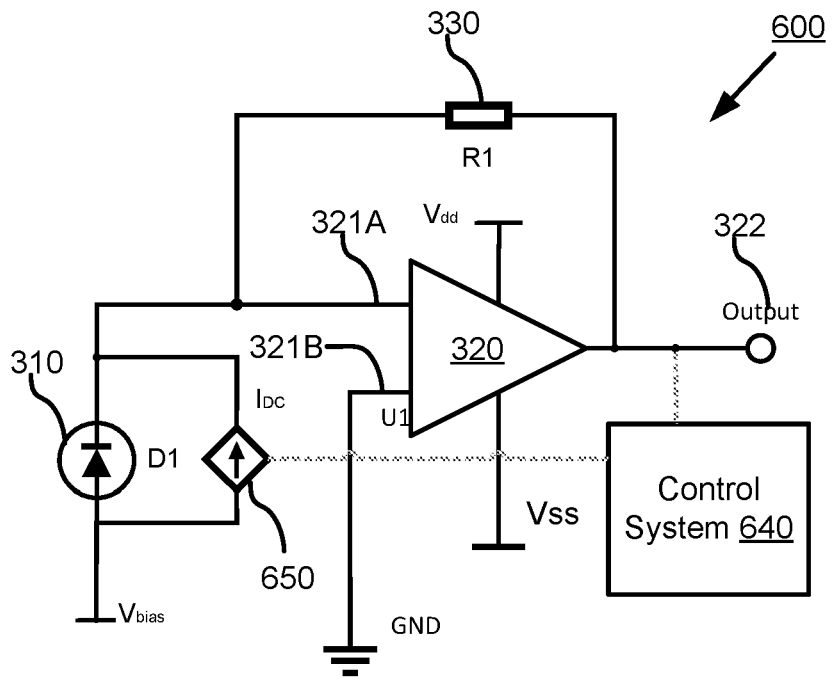

FIG. 6 shows a circuit arrangement 600 to operate the photodiode 310 in zero-mode. Circuit 600 includes a photodiode 310, an amplifier 320, a resistor 330, a control system 640, and a current source 650. The amplifier 320 has two source ports, namely Vdd and Vss, to receive electrical power. The source ports Vdd and Vss provide the full maximum output voltage swing of the amplifier 320.

The amplifier 320 has two input ports 321A, 321B and an output port 322. The output port 322 generates an output voltage Vo. The output port 322 is connected to one of the input ports 321A via the resistor 330 (R1), such that Vo=R× $I_{AC}$, where $I_{AC}$ is the AC current generated by the photodiode 310. The cathode of the photodiode 310 is also connected to the input port 321A. The anode of the photodiode 310 is connected to $V_{bias}$. The other input port 321B is connected to ground.

The current source 650 is connected in parallel to the photodiode 310. The current source 650 is controlled by the control system 640, such that the current generated by the current source 650 drains the DC component generated by the photodiode 310.

The output port 322 is then connected to the control system 640. The control system 640 is in turn connected to the current source 650 to control the amount of current generated by the current source 650.

The control system 640 determines, from voltage Vo at the output port 322, the DC current of the photodiode 310 by calculating the average of voltage Vo at the output port 322 and dividing the average voltage with the gain of the amplifier 320. The control system 640 then provides a control signal to the current source 650 to generate the same current. When the same amount of current is generated by the current source 650, the DC current of the photodiode 310 flows through the current source 650 and only the AC current flows through to the input port 321A.

Similar to circuits 300A and 300B, the voltage output Vo of the output port 322 is provided by the equation Vo=R*$I_{AC}$, where R is the value of the resistor 330 and $I_{AC}$ is the AC current generated by the photodiode 310.

Figure 7:
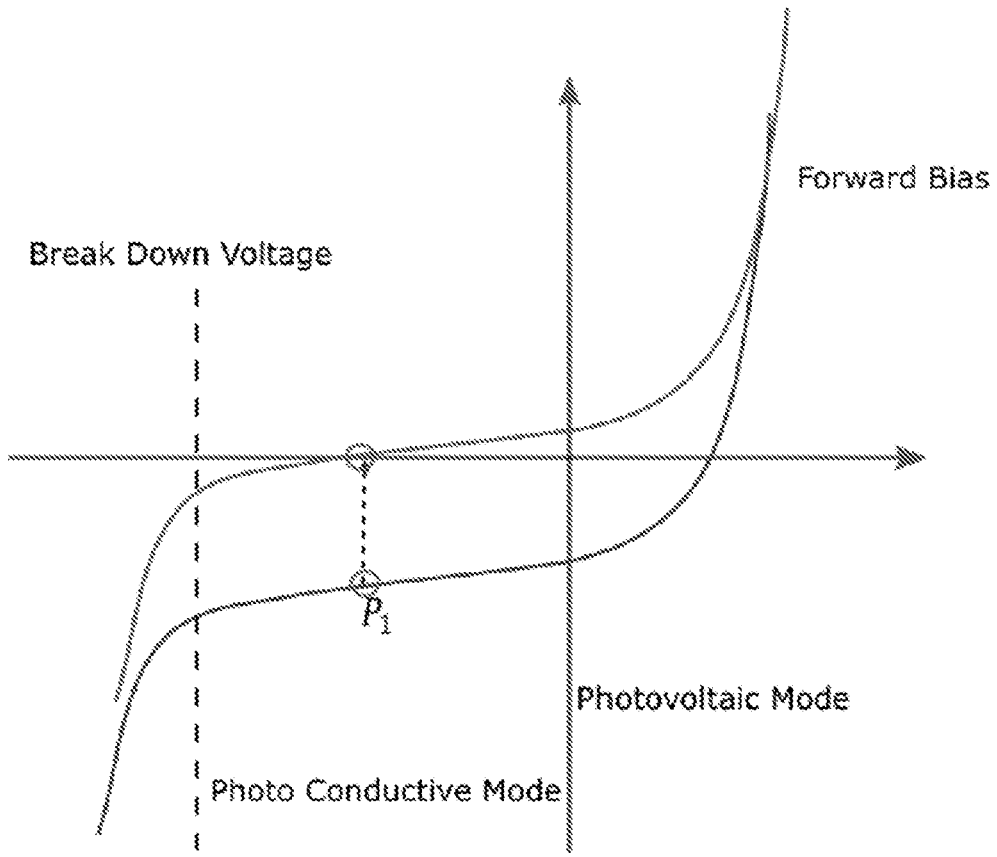
FIG. 7 illustrates the I-V curve of a photodiode in the circuit shown in FIG. 6.

From the I-V curve point of view, the I-V curve of the photodiode 310 of circuit 600 is shifted from the photovoltaic mode to the zero-mode (close to the V-axis). FIG. 7 illustrates the shifting of the I-V curve. When using circuit 600, the photodiode 310 has a similar performance as a photodiode operating in photoconductive mode.

Figure 8:
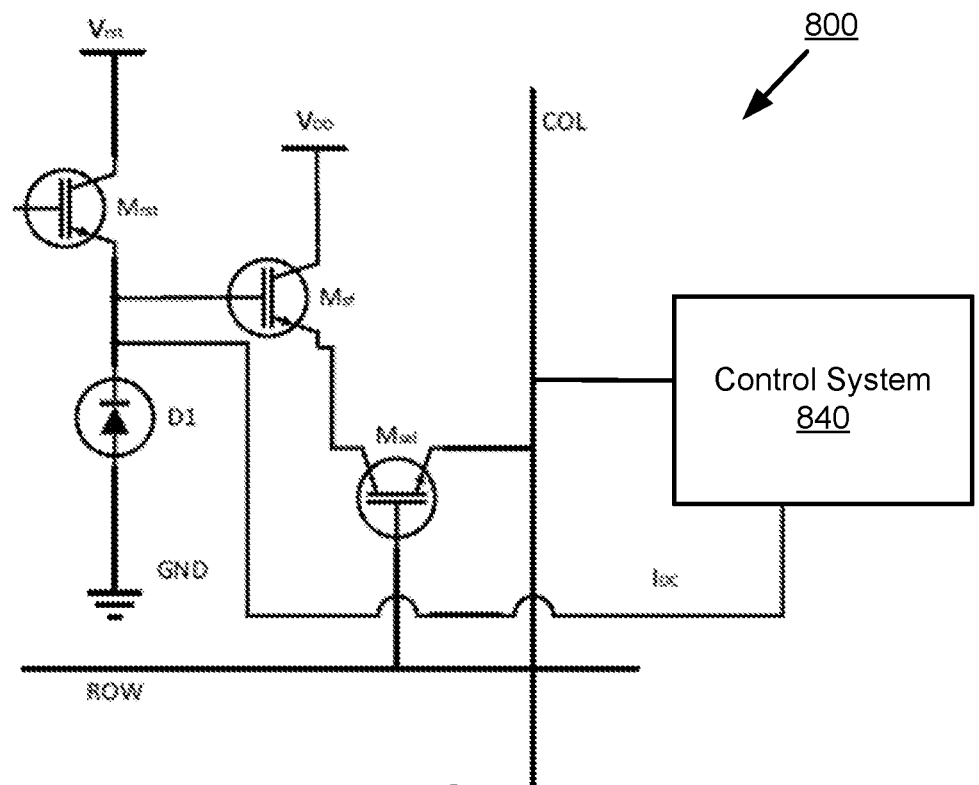
Figure 9:
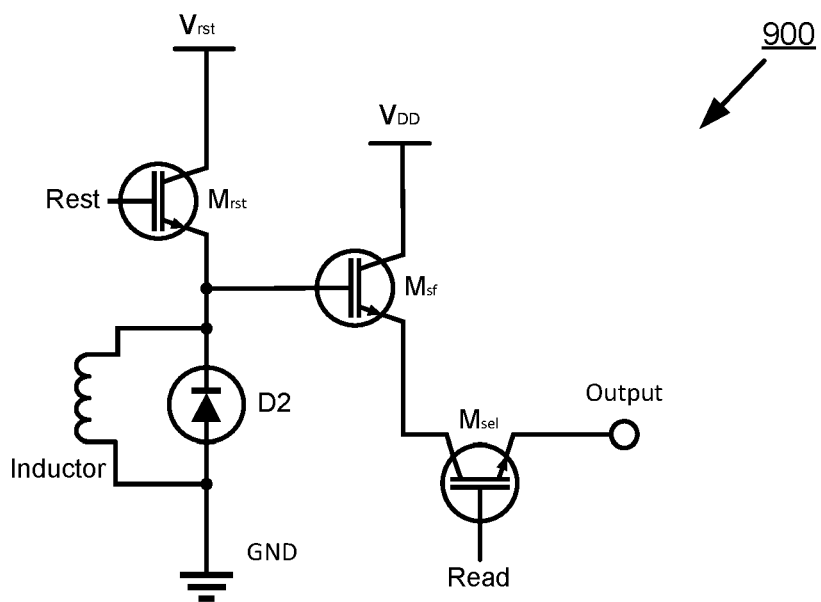

FIGS. 8 and 9 show conventional CMOS sensors using a photodiode that is being operated in zero-mode. FIG. 8 shows a circuit arrangement 800 of CMOS sensors being placed in a typical arrangement, where Mrst is a reset switch, Msf is an amplifier for amplifying the current output from a photodiode D1, and Msel is a selection switch. When Mrst is activated, the circuit 800 is reset and outputs maximum voltage. When Msel is activated and Mrst is not activated, the output of the photodiode D1 is amplified and provided to the output COL. The output COL is connected to a control system 840 for determining the output voltage at COL over a period of time and averaging the output voltage at COL over that period of time. The control system 840 then provides a current (based on the average output voltage at COL) to the photodiode D1 to move the operating point of the photodiode D1 to zero-mode.

FIG. 9 shows a circuit arrangement 900 of CMOS sensors being placed in a typical arrangement, where Mrst is a reset switch, Msf is an amplifier for amplifying the current output from a photodiode D2, and Msel is a selection switch. When Mrst is activated, the circuit 900 is reset and outputs maximum voltage. When Msel is activated and Mrst is not activated, the output of the photodiode D2 is provided to the output. An inductor is placed in parallel with the photodiode D2 to operate the photodiode D2 in zero-mode. The inductor acts as a sink to any DC component generated by the photodiode D2. Such a DC component is generated by, for example, a constant light source. However, the inductor blocks any AC component generated by the photodiode D2, thereby enabling the AC component to flow to the output (when the Msel is activated).

Figure 10:
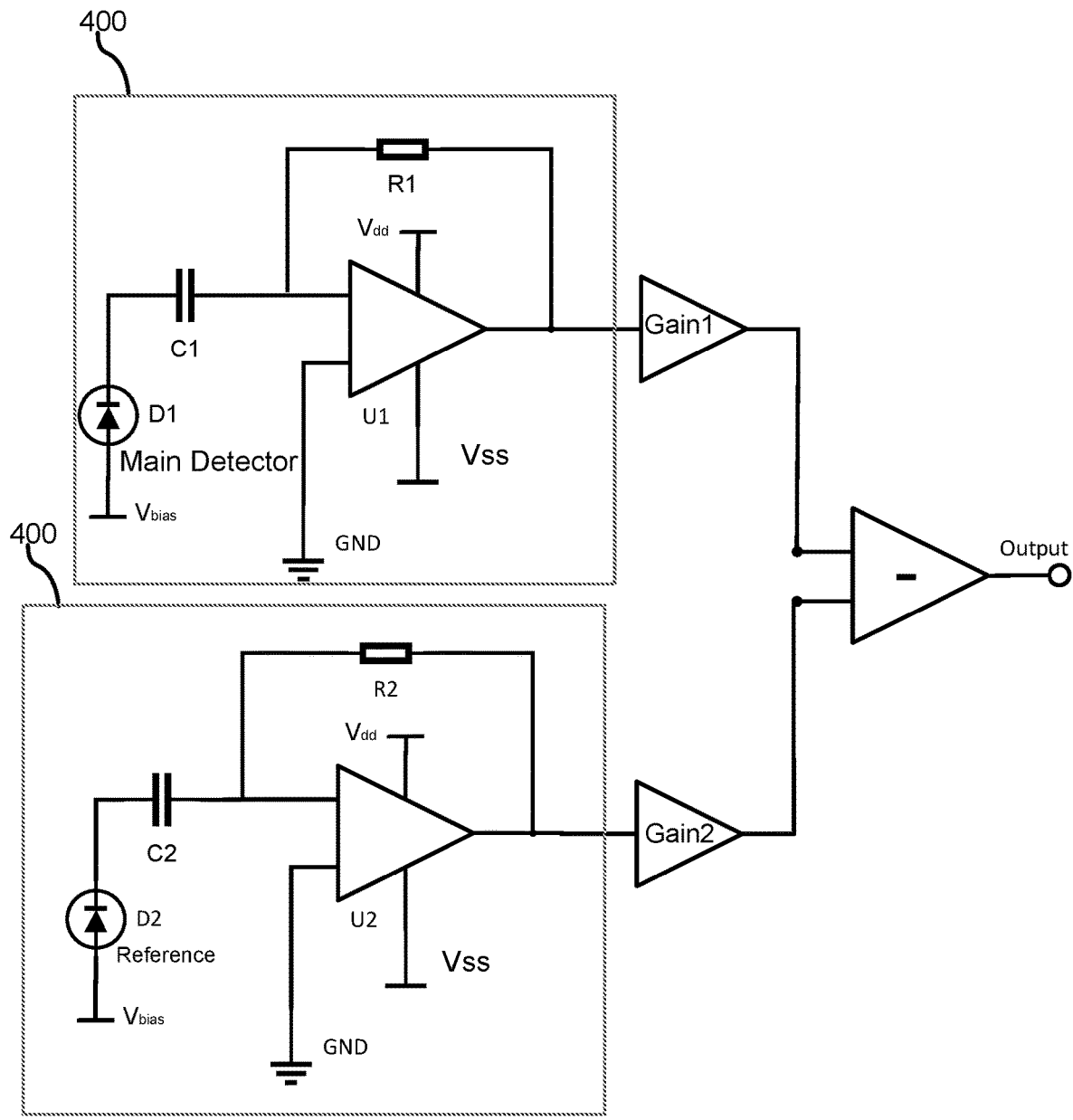

FIG. 10 is a balance detection circuit for detecting the voltage difference between two circuits, where the two circuits employed have photodiodes operating in zero-mode. In FIG. 10, circuit 400 is used where one of the circuits 400 (with the photodiode D2) provides a reference (i.e., detecting noise) and the other of the circuits 400 (with the photodiode D1) acts as the detector (i.e., detecting the signal with the noise). When the outputs of the circuits 400 are provided to the balance detection circuit, the signal is obtained by subtracting the noise of the main detector circuit 400 with the noise from the reference circuit 400.

The zero-mode operation of photodiodes has a few advantages over conventional arrangements. For example, conventional arrangements typically use a photodiode in photoconductive mode, where an amplifier is used with a high-pass filter and potentially a second stage amplifier.

First, the zero-mode photodiode has a much wider maximum output signal voltage swing when compared to a photodiode used in conventional arrangements, when the same gain is used. The conventional arrangements convert and amplify both AC and DC components of the photocurrent to voltage using a transimpedance amplifier and eliminate the DC component using a high-pass filter. Accordingly, the DC component reduces the maximum output voltage swing available to the AC component. In contrast, a zero-mode photodiode only amplifies the AC component, enabling the full maximum output voltage swing of the amplifier to be used for the AC component. Assuming that the conversion gain is G and the saturation voltage is Vmax. The maximum output signal voltage swing of a conventional arrangement is: 2(Vmax−|$I_{DC}$ G|), where $I_{DC}$ is the constant part of the photocurrent. When using the zero-mode operation, the maximum output signal voltage is 2Vmax.

Second, zero-mode photodiodes require fewer components and a less complex design. A reduced maximum output signal voltage swing as explained above may require a second stage of amplification (the design of which is complicated).

In addition, a zero-mode photodiode has better noise performance. For the same input signal and total gain, two stage amplification of conventional arrangement has a larger noise than a one stage amplification used by a zero-mode photodiode. This is because the second stage amplifier amplifies the additive noise from the first stage and also introduces further noise to the output.

Figure 11:
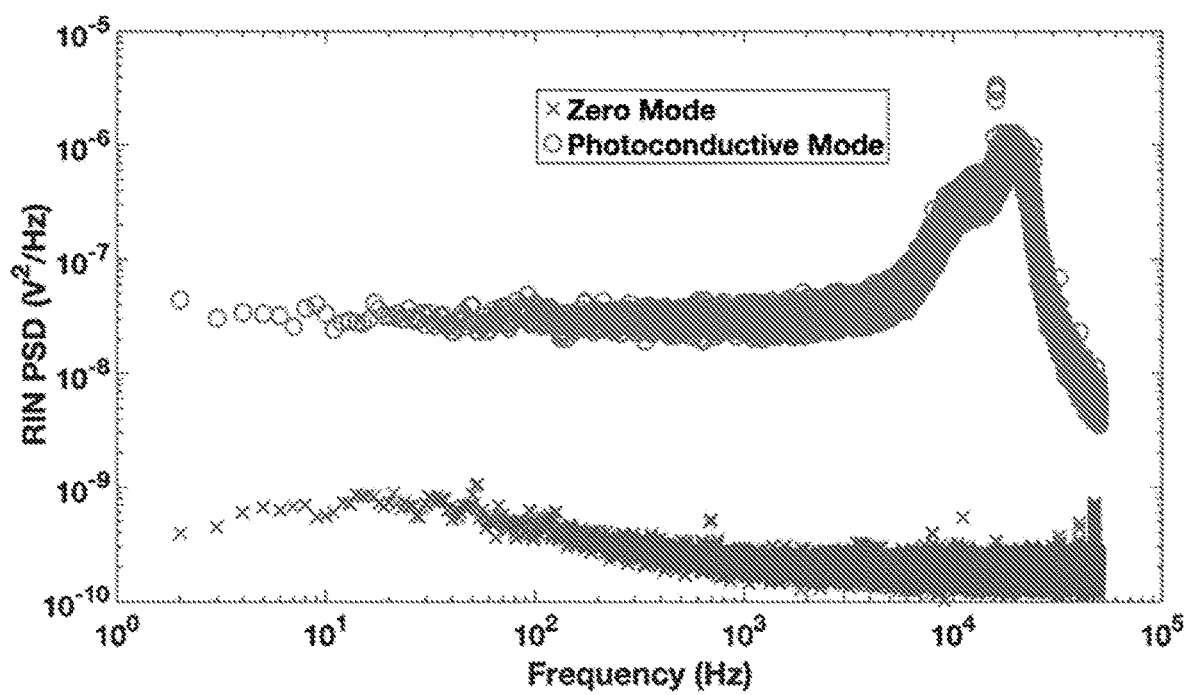
FIG. 11 shows a noise comparison between a photodiode in a photoconductive mode and a photodiode in a zero-mode.

FIG. 11 shows a noise performance comparison between a photodiode operating in photoconductive mode and a photodiode operating in zero-mode.

The components used in the zero-mode circuit and the photoconductive circuit are identical except for the capacitor C. For this comparison, the circuit 400 is used for placing the photodiode in zero-mode. The photodiode is reversely biased by 10V and no additional filters are used. The noise power spectrum is measured with the same constant light irradiation and the noise is referred at the input as shown in FIG. 11. The photoconductive photodiode has a noise peak at around 10 kHz because of the 'gain peaking effect'. Apart from this, the noise floor of the photoconductive mode photodiode is larger than the zero-mode photodiode throughout the spectrum. The root mean square (RMS) of the input referred noise (IRN) of the zero-mode detector is 4.4 mV, whereas that of photoconductive mode photodiode is 96.9 mV.

The IRN is calculated by: IRN=X/gain where X is the output noise when detecting a constant light and the gain is measured from the superposition of the same constant light with a sinusoidal modulation. With this calculation, the detectors' sensitivity is compared when working with the same light source. In other words, the baseline noise of the detector is referred at the input to be compared.

In one example, a 1 mW background light modulated by a sine wave of which amplitude is 3% of the background light and the data acquisition system has an input range of +/−10 mV. To get an output with the best signal to noise ratio, the gain is maximised by choosing the maximum possible resistance R to reach the output limit. For the photoconductive mode photodiode, the maximum gain is 5.55 with a background RMS IRN of 613 μV. For the zero-mode photodiode, the maximum gain is around 209.9 with a RMS IRN of 24 μV. That is, the zero-mode photodiode has a gain of 37.8 times larger than the photoconductive photodiode, while having a noise level that is 25.5 times smaller.

INDUSTRIAL APPLICABILITY

The arrangements described are applicable to the semiconductor and electronics industries and particularly for operating a photodiode.

The foregoing describes only some embodiments of the present invention, and modifications and/or changes can be made thereto without departing from the scope and spirit of the invention, the embodiments being illustrative and not restrictive.

In the context of this specification, the word "comprising" means "including principally but not necessarily solely" or "having" or "including", and not "consisting only of". Variations of the word "comprising", such as "comprise" and "comprises" have correspondingly varied meanings.

The invention claimed is:

1. A circuit configured for detecting light with fluctuating light power, comprising:
    a photodiode configured for detecting the light with fluctuating light power,
    an amplifier; and
    a control system configured to:
        determine an average output voltage of the amplifier over a period of time; and
        control an input to the photodiode based on the average output voltage of the amplifier that was determined to shift an operating point of the photodiode to zero-mode,
    wherein the circuit is configured for operating the photodiode at the zero-mode for certain light power, wherein the certain light power falls within the fluctuating light power of the detected light,
    wherein, in the zero-mode, the photodiode operates at zero current.

2. The circuit of claim 1, wherein the control system is configured to provide the determined average output voltage to the photodiode as a bias voltage such that the bias voltage shifts the operating point of the photodiode to the zero-mode.

3. The circuit of claim 1, wherein the circuit comprises a current source configured to drain current of the photodiode so that the photodiode operates at the zero-mode.

4. The circuit of claim 3, wherein the control system is configured to:
    determine an average current of the photodiode based on the average output voltage of the amplifier that was determined, and
    provide a control signal to the current source so that the current source generates the average current that was determined.

5. The circuit of claim 1, wherein the control system is configured to bias the photodiode.

6. A balance detection circuit comprising a first circuit and a second circuit, wherein the first circuit and the second circuit are in accordance with the circuit of claim 1.

7. The circuit of claim 6, wherein a first input of the amplifier is electrically connected to the photodiode and a second input of the amplifier is electrically connected to a reference voltage.

8. The circuit of claim 1, wherein the control system is configured to determine a first bias voltage value and a second bias voltage value corresponding to threshold current values for operating the photodiode at zero-current.

9. The circuit of claim 8, wherein the control system is configured to:
    determine whether a value of the average output voltage is below the first bias voltage value and above the second bias voltage value; and
    output the average output voltage as the bias voltage if the value of the average output voltage is below the first bias voltage value and above the second bias voltage value.

10. A circuit configured for detecting light with fluctuating light power, comprising:
    a photodiode coupled to an amplifier, wherein the photodiode is configured to detect the light with fluctuating light power; and
    a control system configured to control a bias voltage provided to the amplifier, wherein the amplifier is configured to receive the bias voltage and a current of the photodiode, such that the bias voltage shifts an operating point of the photodiode to a zero-mode, wherein the circuit is configured for operating the photodiode at zero-mode for certain light power, wherein the certain light power falls within the fluctuating light power of the detected light, and wherein, in the zero-mode, the photodiode operates at zero current.

11. The circuit of claim 10, wherein the control system is configured to determine an average output voltage of the amplifier over a period of time and configured to provide the average output voltage as the bias voltage.

12. The circuit of claim 11, wherein the control system is configured to determine a first bias voltage value and a second bias voltage value corresponding to threshold current values for operating the photodiode at zero-current.

13. The circuit of claim 12, wherein the control system is configured to:

determine whether a value of the average output voltage is below the first bias voltage value and above the second bias voltage value; and output the average output voltage as the bias voltage if the value of the average output voltage is below the first bias voltage value and above the second bias voltage value.

14. A balance detection circuit comprising a first circuit and a second circuit, wherein the first circuit and the second circuit are in accordance with the circuit of claim 10.

15. A circuit configured for detecting light with fluctuating light power, comprising:

a photodiode configured for detecting the light with fluctuating light power, a capacitor; and an amplifier, wherein a first input of the amplifier is electrically connected to the photodiode via the capacitor and a second input of the amplifier is electrically connected to a reference voltage, wherein the circuit is configured for operating the photodiode at a zero-mode for certain light power, wherein the certain light power falls within the fluctuating light power of the detected light, and wherein, in the zero-mode, the photodiode operates at zero current.

16. A balance detection circuit comprising a first circuit and a second circuit, wherein the first circuit and the second circuit are in accordance with the circuit of claim 15.

17. A circuit configured for detecting light with fluctuating light power, comprising:

a photodiode configured for detecting the light with fluctuating light power, wherein the circuit comprises an inductor that is in parallel with the photodiode, wherein the circuit is configured for operating the photodiode at a zero-mode for certain light power, wherein the certain light power falls within the fluctuating light power of the detected light, and wherein, in the zero-mode, the photodiode operates at zero current.

18. A balance detection circuit comprising a first circuit and a second circuit, wherein the first circuit and the second circuit are in accordance with the circuit of claim 17.

19. A circuit configured for detecting light, comprising:

a photodiode configured for detecting the light with fluctuating light power;

an inductor; and an amplifier, wherein the inductor is connected in series with the photodiode between a bias voltage and a reference voltage, wherein a first input of the amplifier is electrically connected to a point where the photodiode is connected to the inductor, and a second input of the amplifier is electrically connected to the bias voltage, and wherein the circuit is configured for operating the photodiode at zero-mode.

20. A circuit configured for detecting light, comprising:

a photodiode; and an amplifier, wherein the circuit is configured for operating the photodiode at zero-mode, wherein, in the zero-mode, the photodiode operates at zero current, wherein the circuit comprises a control system configured to control a bias voltage provided to the photodiode, such that the bias voltage shifts an operating point of the photodiode to the zero-mode, wherein a first input of the amplifier is electrically connected to the photodiode and a second input of the amplifier is electrically connected to a reference voltage, and wherein the control system is configured to perform operations comprising:

determining an average output voltage of the amplifier over a period of time and is configured to provide the average output voltage as the bias voltage;

determining a first bias voltage value and a second bias voltage value corresponding to threshold current values for operating the photodiode at zero-current;

determining whether a value of the average output voltage is below the first bias voltage value and above the second bias voltage value; and outputting the average output voltage as the bias voltage if the value of the average output voltage is below the first bias voltage value and above the second bias voltage value.

* * * * *